(12) United States Patent
Lim

(10) Patent No.: US 11,658,631 B1
(45) Date of Patent: May 23, 2023

(54) SYSTEM AND METHOD FOR AUTOMATICALLY TUNING AN AUDIO SYSTEM

(71) Applicant: Harman International Industries, Incorporated, Stamford, CT (US)

(72) Inventor: Joel Chu Ming Lim, Nagoya (JP)

(73) Assignee: Harman International Industries, Incorporated, Stamford, CT (US)

(*) Notice: Subject to any disclaimer, the term of this patent is extended or adjusted under 35 U.S.C. 154(b) by 0 days.

(21) Appl. No.: 17/569,013

(22) Filed: Jan. 5, 2022

(51) Int. Cl.
| | |
|---|---|
| H04L 7/00 | (2006.01) |
| H03G 3/30 | (2006.01) |
| H03G 5/24 | (2006.01) |
| H04S 7/00 | (2006.01) |
| H03G 3/32 | (2006.01) |
| H04R 29/00 | (2006.01) |

(52) U.S. Cl.
CPC ............ *H03G 3/3089* (2013.01); *H03G 3/32* (2013.01); *H03G 5/24* (2013.01); *H04R 29/00* (2013.01); *H04S 7/307* (2013.01)

(58) Field of Classification Search
CPC .......... H03G 3/3089; H03G 5/24; H03G 3/32; H04S 7/307; H04S 7/302; H04S 7/30; H04S 7/301; H04R 29/001; H04R 5/02; H04R 3/04; H03F 3/68
USPC .................................. 375/356, 373, 375, 371
See application file for complete search history.

(56) References Cited

U.S. PATENT DOCUMENTS

| | | | |
|---|---|---|---|
| 10,469,046 B2* | 11/2019 | Celestinos Arroyo ... | H04R 3/04 |
| 2005/0031135 A1* | 2/2005 | Devantier ............... | H04S 7/302 |
| | | | 381/59 |
| 2005/0169488 A1* | 8/2005 | Kato ....................... | H04S 7/302 |
| | | | 381/98 |
| 2005/0259831 A1* | 11/2005 | Hutt ........................ | H04R 5/02 |
| | | | 381/86 |
| 2007/0086597 A1* | 4/2007 | Kino ....................... | H04S 7/301 |
| | | | 381/59 |
| 2010/0208900 A1* | 8/2010 | Amadu .................... | H04S 7/30 |
| | | | 381/17 |
| 2014/0314256 A1* | 10/2014 | Fincham ................. | H04S 7/307 |
| | | | 381/303 |
| 2017/0111736 A1* | 4/2017 | Ge ........................... | H03F 3/68 |
| 2022/0360926 A1* | 11/2022 | Brännmark et al. . | H04R 29/001 |

* cited by examiner

*Primary Examiner* — Phuong Phu
(74) *Attorney, Agent, or Firm* — Angela M. Brunetti

(57) ABSTRACT

A phase optimizer optimizes, for each listening position in a listening environment, a phase shift for each frequency in a range of predetermined frequencies. The phase optimizer determines a resultant phase value for each possible phase shift value and stores the resultant phase values for each possible phase shift value in an array. The phase optimizer calculates mean and standard deviation for the resultant phases stored in the array. The mean and standard deviations stored in the array are compared and phase shift values that result in the resultant phase values having the smallest mean and standard deviations are selected and are stored in memory. The phase optimizer optimizes each frequency, within a predetermined range of frequencies, for all possible phase shift values within a predetermined range of phase shift values and generates a phase shift target curve generated to be output by the phase optimizer.

13 Claims, 9 Drawing Sheets

| Frequency (Hz) | Magnitude (dB) | Phase (degrees) | Coherence |
|---|---|---|---|
| 10.742188 | -16.94 | 154.05 | 0.70 |
| 11.718750 | -17.20 | 133.17 | 0.90 |
| 12.695313 | -18.12 | 120.29 | 0.94 |
| 13.671875 | -17.49 | 106.64 | 0.96 |
| 14.648438 | -15.75 | 92.31 | 0.92 |
| 15.625000 | -13.72 | 84.77 | 0.86 |
| 16.601563 | -13.00 | 76.82 | 0.90 |
| 17.578125 | -13.41 | 70.01 | 0.94 |
| 18.554688 | -13.68 | 68.26 | 0.98 |
| 19.531250 | -13.41 | 65.68 | 0.98 |
| 20.507813 | -13.30 | 60.08 | 0.98 |
| 21.484375 | -12.73 | 49.76 | 0.98 |
| 22.460938 | -12.03 | 40.57 | 0.98 |
| ⋮ | ⋮ | ⋮ | ⋮ |
| 19199.998047 | -27.40 | -135.92 | 0.06 |
| 19333.332031 | -27.33 | -138.67 | 0.06 |
| 19466.666016 | -27.25 | -140.63 | 0.08 |
| 19600.000000 | -27.19 | -141.91 | 0.05 |
| 19733.333984 | -27.13 | -142.69 | 0.12 |
| 19866.667969 | -27.10 | -143.04 | 0.02 |
| 20000.001953 | -27.09 | -143.10 | 0.09 |

FIG. 9

SYSTEM AND METHOD FOR AUTOMATICALLY TUNING AN AUDIO SYSTEM

TECHNICAL FIELD

The present disclosure relates to tuning an audio system in a listening environment and more particularly to a system and method for automatically tuning the audio system for multiple listening locations within the listening environment.

BACKGROUND

Audio systems, such as home theater systems, home audio systems, vehicle audio systems, have multiple components that include a sound processor driving one or more speakers with amplified audio signals. The audio system may have various components that may be installed in a listening environment in an almost unlimited number of configurations. Additionally, the listening environment, within which the components are installed, has a significant impact on the sound produced by the audio system in the listening environment. Once installed, the audio system is tuned to produce a desirable, or optimized, sound field within the listening environment.

Tuning the audio system may include configuring the system to process audio signals by adjusting the equalization, delay and/or filtering to compensate for the components and/or the listening environment. Tuning involves several steps, including, but not limited to, equalization, delay, and phase optimization. Automatic optimization software exists for many of these steps, excluding phase optimization. Due to the complexity of phase optimization, this step is usually skipped altogether, or it is performed manually by an acoustics engineer.

In many audio systems, such as multi-channel cars and home audio systems, the number of filter combinations far exceeds a human being's capability to fully optimize the audio system. The number of possible filter permutations increase exponentially with the number of speakers in the audio system. Therefore, any output that is the result of human heuristics and subjective listening is expected to be ambiguous in terms of whether it is truly the most optimized solution.

Software-based tuning may improve the speed and accuracy of the manual tuning process. However, existing software-based tuners are fully integrated with the audio system. Further, automatic equalizers only optimize equalization and delay, not phase. Software-based tuning is not cross-compatible with a variety of legacy systems, current products, and future products. More particularly, such a fully integrated system cannot be used across audio systems from different manufacturers without having to make extensive modifications to adapt the optimizer to the system specific to the manufacturer.

There is a need for a software-based system and method for automatically tuning an audio system. And more particularly for a software-based system and method for automatically tuning an audio system having multiple speakers in a listening environment having multiple listening locations that consistently produces optimal tuning results and is capable of being used to tune legacy, current and future components of the audio system.

SUMMARY

One or more embodiments describe a software-based automated process for tuning an audio system having one or more speakers in a listening environment having one or more listening locations. The system and method consistently produce optimal tuning results and may be applied to legacy, current, and future components in audio systems from any manufacturer.

An automated phase optimization system and method for tuning an audio system having one or more loudspeakers, the audio system is installed in a listening environment having one or more listening positions. A processor receives a text file input of impulse response (IR) data measurements for each loudspeaker from each listening position measured for all possible frequencies within a predetermined range of frequencies. The impulse response measurements are taken by a measurement system that is decoupled from the phase optimizer. A phase optimizer optimizes each frequency in the range of predetermined frequencies. For each listening position, the phase optimizer determines a resultant phase for each possible phase shift value within a predetermined range of phase shift values by applying the phase shift values to each IR data measurement. The phase optimizer determines stores the resultant phase values in an array. The phase optimizer calculates mean and standard deviation for the resultant phase values stored in the array. The mean and standard deviations stored in the array are compared and phase shift values that result in resultant phase values having the smallest mean and standard deviations are selected and are stored in memory. The phase optimizer repeats these steps to optimize each frequency, within a predetermined range of frequencies, for all possible phase shift values within a predetermined range of phase shift values. The phase optimizer generates a phase shift target curve by selecting phase shift values for each frequency that result in resultant phase values having the smallest mean and standard deviation.

In one or more embodiments the phase shift target curve is translated into a format that is compatible with a filter configuration of a digital signal processor in the audio system. The translation may take place in a module that is decoupled from the phase optimizer. The translation may take place in a module that is also decoupled from the digital signal processor in the audio system.

DESCRIPTION OF DRAWINGS

FIG. 9 is an example of a partial text file of untuned impulse response measurements.

Elements and steps in the figures are illustrated for simplicity and clarity and have not necessarily been rendered according to any sequence. For example, steps that may be performed concurrently or in different order are illustrated in the figures to help to improve understanding of embodiments of the present disclosure.

DETAILED DESCRIPTION

While various aspects of the present disclosure are described with reference to a phase optimizer, the present disclosure is not limited to such embodiments, and additional modifications, applications, and embodiments may be implemented without departing from the present disclosure. In the figures, like reference numbers will be used to illustrate the same components. Those skilled in the art will recognize that the various components set forth herein may be altered without varying from the scope of the present disclosure.

Figure 1:
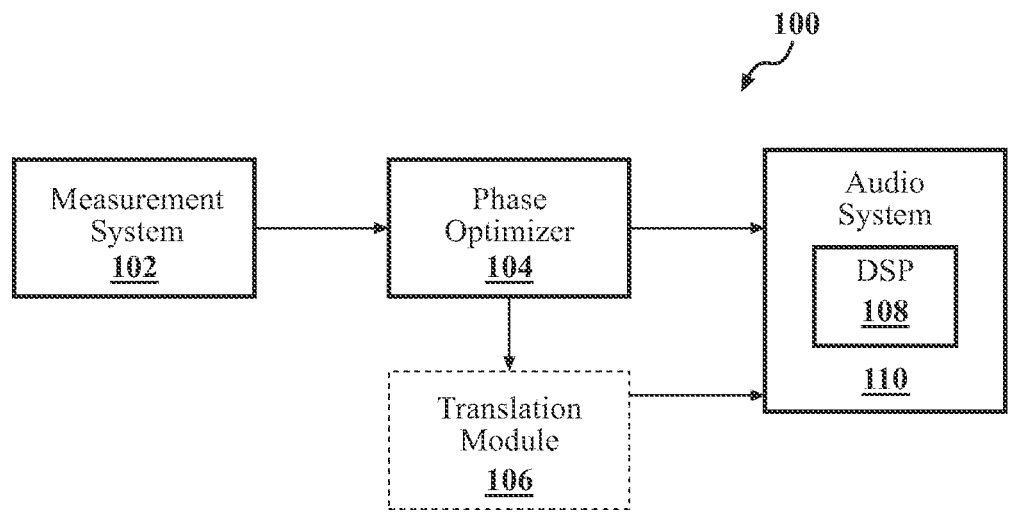
FIG. 1 is a block diagram of a phase optimizer system.

The detailed description is directed to audio systems and methods to improve tuning the audio system. FIG. 1 is a block diagram of system 100 for tuning an audio system in a listening environment. A measurement system 102, a phase optimizer 104, and an optional translation module 106, are decoupled from each other and from a DSP 108 of the audio system 110. The phase optimizer 104 is decoupled from the measurement system 102 and it is also decoupled from the audio system, making it compatible with any legacy, current or future configuration of audio systems. Therefore, the audio system does not require modifications to use an output of the phase optimizer 104. The phase optimizer 104 receives raw untuned data from the measurement system 102. The, optional, translation module 106, also decoupled from the phase optimizer 104 and the audio system, may convert the output of the phase optimizer, as needed, based on a filter configuration of the audio system 110. Finally, the DSP 108 of the audio system 110, which is decoupled from the translation module, receives (from either the phase optimizer 104 or, optionally, from the translation module 106) and applies the phase shift optimizer output.

Decoupled does not necessarily mean that each module or system must be carried out by a separate processor. This may be the case, but one processor may also be used to execute each module or system. The decoupling is a disassociation of any interrelationship, or dependence, among the modules and the DSP. Each module/system is carried out independent of the others, yet each module/system are compatible and capable of communicating with each other because of the basic format of data and information that is being input to and output from each of the systems/modules.

Computer-readable instructions are stored in a memory of a computing system. The computing system executes instructions to process and analyze the raw data and formats the analyzed data into a phase shift target curve. The computing system also executes instructions to output the phase shift target curve to be implemented by the DSP of the audio system regardless of the type of filter system used by the audio system. For example, the target curve may be applied to a DSP system having FIR filters or it may be applied to a DSP system having biquad all pass filters.

In one or more embodiments, the measurement system 102, the phase optimizer, the translation module 106 each may be considered a module or a system. The phase optimizer outputs a phase shift target curve that may be translated into DSP parameters that are compatible with the DSP, and the DSP executes the parameters. Each module or system may be carried out in a separate computing system and the DSP is independent of the modules.

In one or more embodiments, each module or system, while remaining decoupled from the other modules and systems, may all be carried out by the DSP embedded in the audio system. Alternatively, each module or system, while remaining decoupled from the others, may be carried out in any combination of one or more processors. The combination of computing systems for executing modules and systems may be implemented without departing from the scope of the inventive subject matter when each module or system is decoupled from the others.

Figure 2:
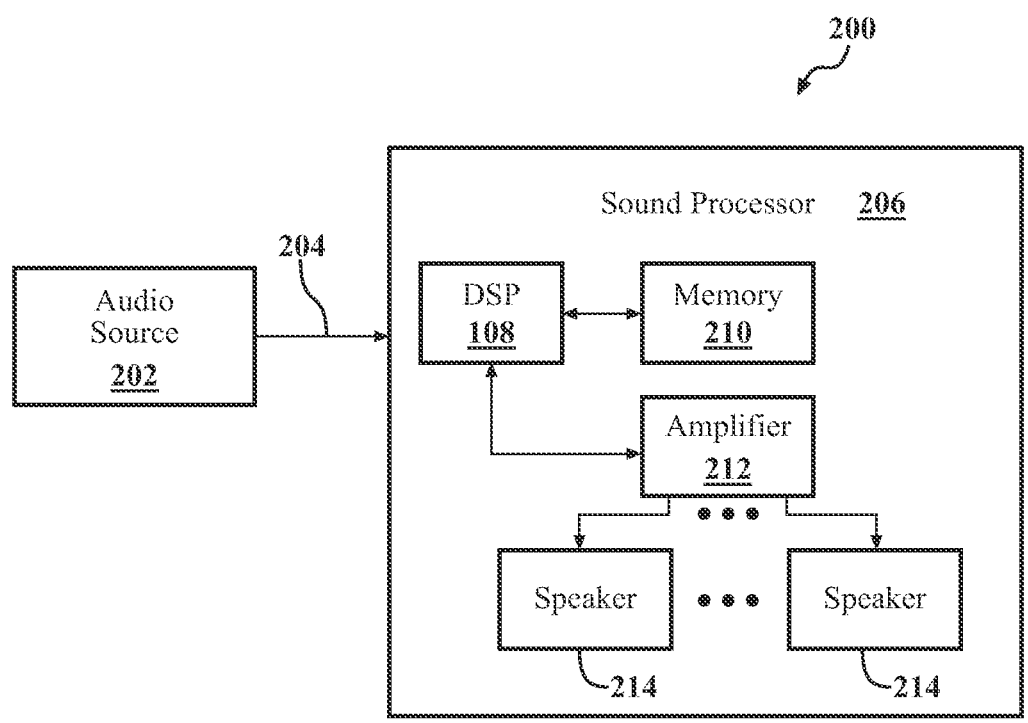
FIG. 2 is a block diagram of an example audio system.

FIG. 2 is a block diagram of a simple audio system 200. The audio system 200 has a source 202 that provides an audio input 204. The source 202 may include, but is not limited to, a tuner, a CD player, a DVD player, a television to name some examples. The audio input 204 is received by a sound processor 206.

The sound processor 206 may include the digital signal processor (DSP) 108 and a memory 210. DSP 108 may be single core or multi-core, and programs executed by DSP 108 may be configured for parallel or distributed processing. Memory 210 may include any non-transitory tangible computer readable medium in which programming instructions are stored. Computer-readable instructions are stored on a non-transitory computer readable medium, such as flash memory, ROM, RAM, cache, etc. Memory 210 may include volatile, non-volatile, removable, or non-removable media for storage of computer readable program instructions or modules of computer readable storage mediums.

The audio system 200 also includes an amplifier 212 and one or more speaker components 214. Each of the speaker components 214 may have multiple transducers operating in different frequency bands. Tuning the audio system typically involves measuring impulse responses (IR) and optimizing the system based on the IR measurements so that each speaker operates at a particular range of acoustical frequencies for each listening position in a listening environment.

Figure 3:
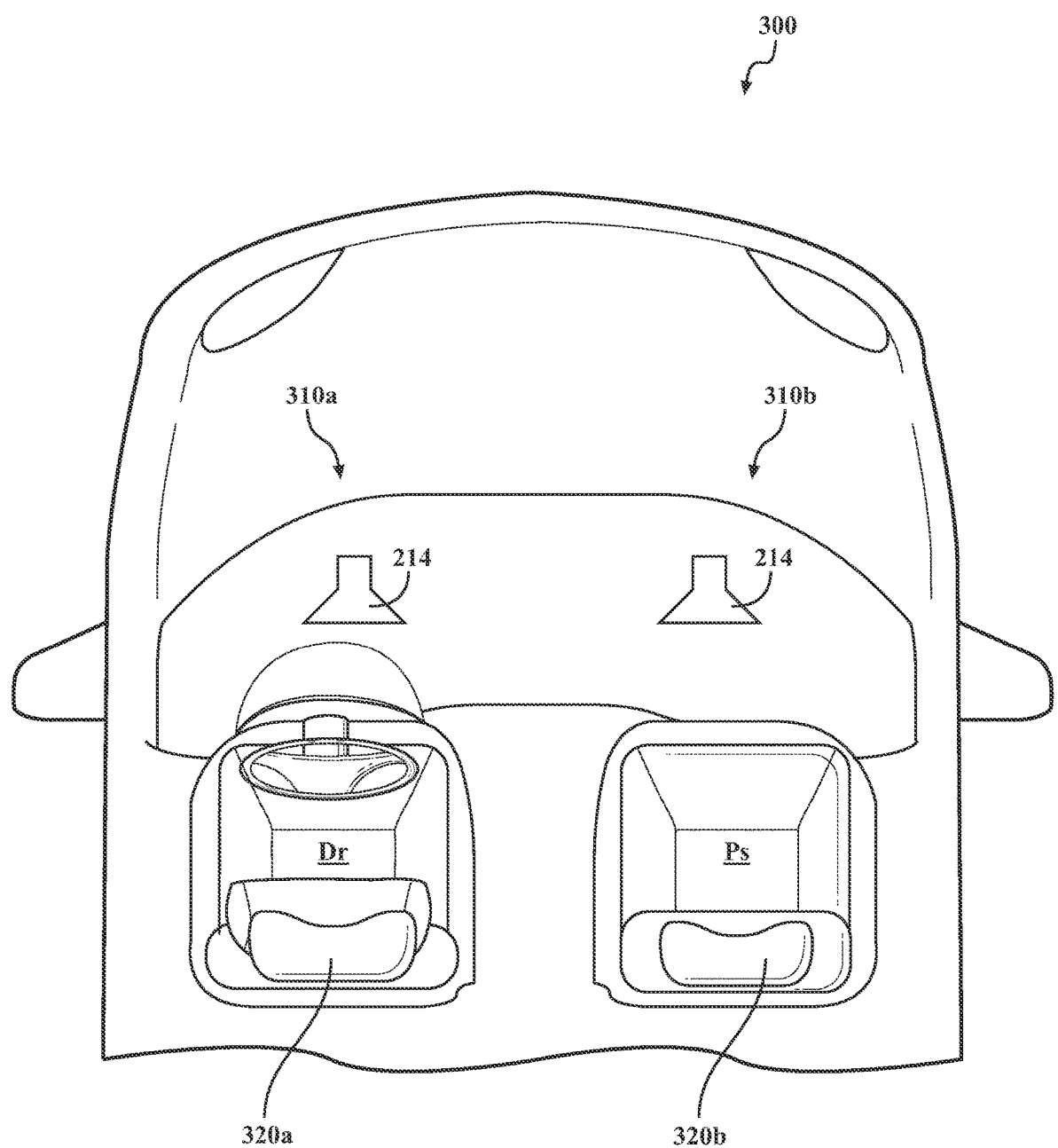
FIG. 3 is an example listening environment.

FIG. 3 is a block diagram of an example listening environment 300. While a vehicle interior is shown by example in FIG. 3, it should be noted that the listening environment 300 may also be a recording studio, a domestic living space, a concert hall, or a movie theater, to name some examples. A speaker location is a physical place in the listening environment where the speaker is positioned. For example, the location may be in a corner, on a wall, on a floor, in the ceiling, or in a panel (interior or exterior) of a vehicle, or a compartment of a vehicle interior. In the example shown in FIG. 3, the listening environment 300 includes first and second speaker locations 310a and 310b. The first speaker location 310a in FIG. 3 is a location near a driver (Dr) position in the vehicle and may also be referred to hereinafter as a left front speaker location 310a. The second speaker location 310b is a location near a passenger (Ps) position in the vehicle and may also be referred to hereinafter as a right front speaker location 310b. Two locations are shown for simplicity purposes. However, it should be noted that fewer or more locations may be possible and one skilled in the art can translate the inventive subject matter for an audio system and listening environment having more than two speaker locations without departing from the scope of the inventive subject matter.

A listening position is the physical area in the listening environment where a listener may be seated. In the listening environment 300 shown in FIG. 3, there are two listening positions, a first listening position 320a, and a second listening position 320b. Again, it should be noted that fewer or more listening locations may be possible and one skilled in the art may carry out measurements of the IR for more than two listening locations without departing from the scope of the inventive subject matter described herein. In the example shown in FIG. 3 the first listening position 320a may also be referred to hereinafter as a driver (Dr) listening position 320a and the second listening position 320b may also be referred to hereinafter as a passenger (Ps) listening position 320b.

When tuning the audio system, a predetermined target is set, and performance is balanced in several listening locations simultaneously. An ideal target is to achieve zero phase difference in all listening positions. In practice, it is mathematically impossible to achieve zero phase difference in multiple listening positions. Therefore, a more realistic approach is to define a predetermined target that minimizes phase difference at each listening position.

There are several options available, as far as phase shifts for each frequency bin, which may result in balanced performance to meet the predetermined target. However, it is not always clear which option, or options, will be successful. Furthermore, even though there may be several options that meet the predetermined target, it may not be readily clear which option represents an optimum result. In the description herein, the predetermined target will focus on phase coherence between first and second speaker locations at first and second listening positions within the listening environment. However, it should be noted that the same principles and concepts described herein may also be applied to center integration, front-rear integration, and subwoofer integration for more than two speaker locations and more than two listening positions.

Tuning the audio system in the listening environment 300 involves positioning a speaker 214 at each of the potential speaker locations 310a-b, playing an audio input 204, and taking measurements of an impulse response (IR) at each of the listening locations 320a-b. Raw data of the IR is collected at each of the listening positions for each of the speaker locations by measuring IR. IR may include, for example, amplitude, and phase components, one or more frequencies or tones, frequency resolution, phase deviations. As discussed above, the means for taking IR measurements is not limited herein. Any means for collecting IR measurements may be used and only the format in which the measurements are stored is of interest in the inventive subject matter. The measurement system is decoupled from the phase optimizer of the inventive subject matter. The IR measurements are taken by any external measuring system and stored as a text file. The text file is imported into the phase optimizer, which will be discussed in detail later herein.

An example of a partial text file is shown in FIG. 9. The data is representative of the IR measurements taken for the left front speaker location 310a at the driver side listening position 220a for frequencies from 10 Hz to 2kHz. The measurements for each frequency include magnitude, phase and phase coherence. For simplicity, not all possible frequencies in the predetermined range of frequencies are shown in FIG. 9. The predetermined range of frequencies in the example shown in FIG. 9 is 10.742188 Hz to 20000.001953 Hz.

For the example listening environment shown in FIG. 3, having two speaker locations, the left front speaker location 310a and the right front speaker location 310b; and two listening positions, the driver listening position 320a, and the passenger listening position 320b, a measurement system 102 takes four sets of IR measurements to perform left-right (LR) coherence analysis. The raw data is stored in text files (as shown in FIG. 9) for input to the phase optimizer 104. For example:

Set (1) is raw data taken for the left front speaker location 310a at the driver (Dr) listening position 320a, as shown by example in FIG. 9;

Set (2) (not shown) is raw data taken for the right front speaker location 310b at the driver (Dr) listening position 320a;

Set (3) (not shown) is raw data taken for the right front speaker location 310b at the passenger (Ps) listening position 320b; and Set (4) (not shown) is raw data taken for the left front speaker location 310a at the passenger (Ps) listening position 320b.

Figure 4A:
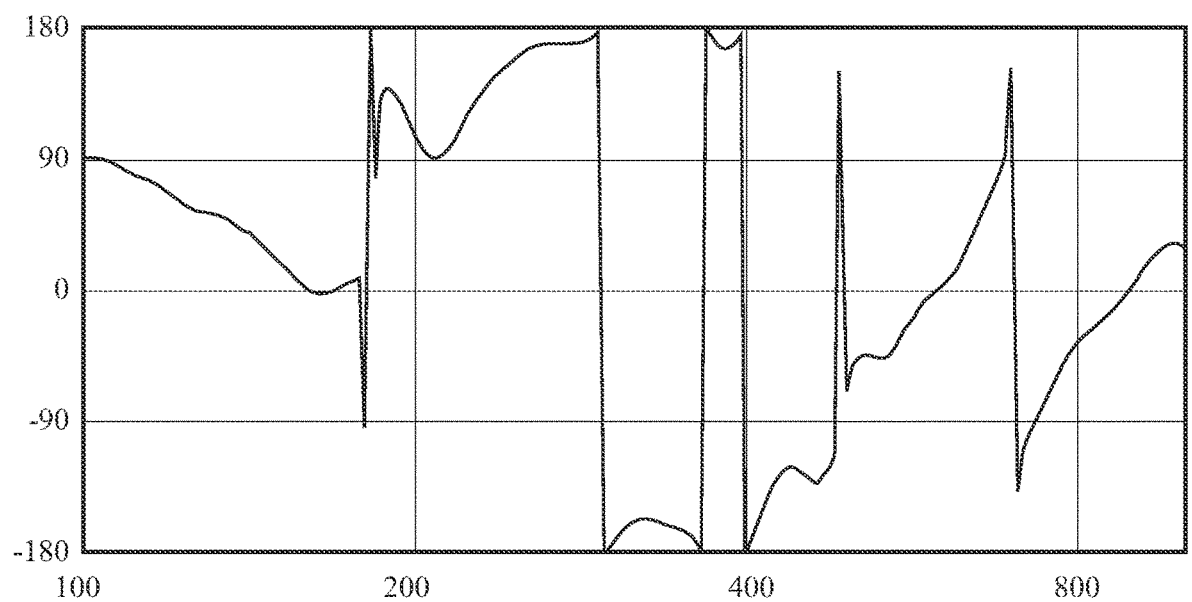
FIG. 4A is a graph representing the difference in raw untuned phase response in a first listening position.

FIG. 4A is a graph representing the difference in raw untuned phase response at the driver (Dr) listening position 320a between the left front speaker location 310a and the right front speaker location 310b. An ideal zone for the phase is ±90. In FIG. 4A, the difference, for the raw untuned phase response at some of the frequencies falls within a range ±180, which is undesirable and could result in poor audio output from the audio system.

Figure 4B:
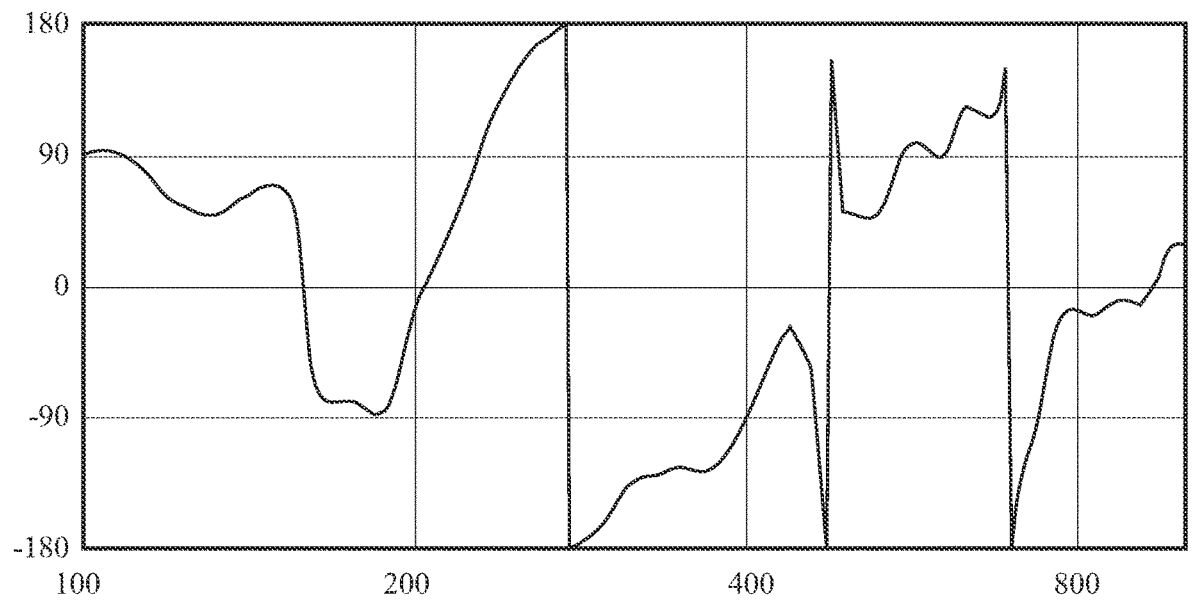
FIG. 4B is a graph representing the difference in raw untuned phase response in a second listening position.

FIG. 4B is a graph representing the difference in raw, untuned phase response at the passenger (Ps) listening position 320b between the left front speaker location 310a and the right front speaker location 310b. In FIG. 4B, the phase is also ±180 and is undesirable.

Figure 4C:
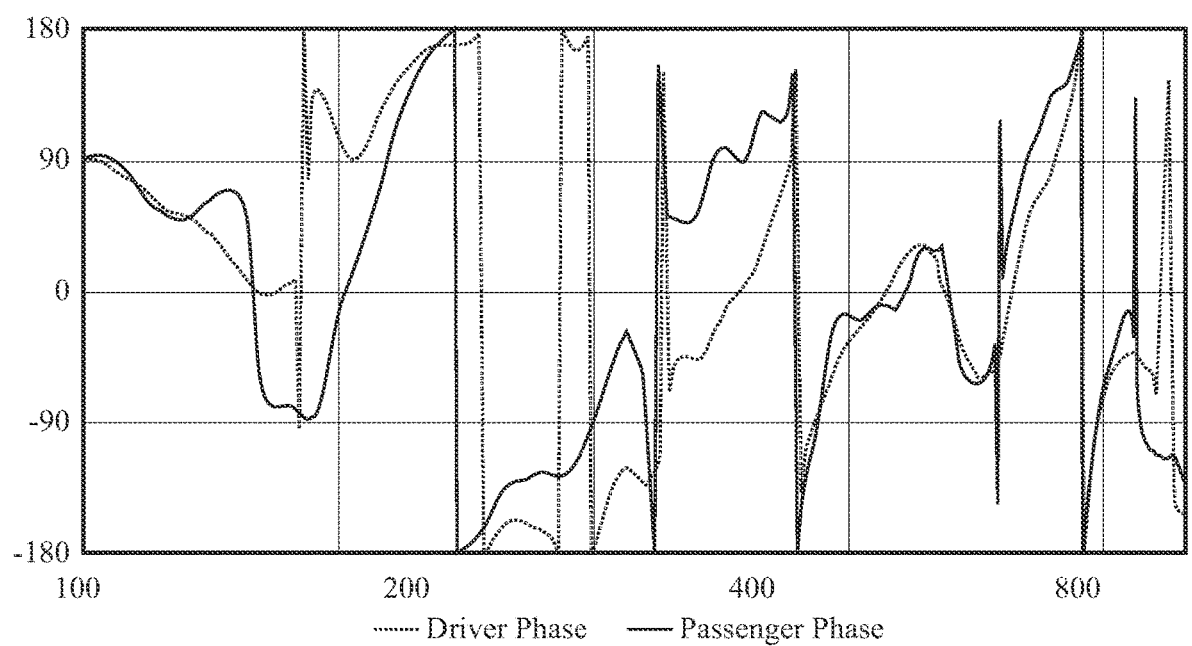
FIG. 4C is a comparison graph of FIGS. 4A and 4B.

FIG. 4C is a graph that represents near-side and far-side phase difference for the driver (Dr) phase and the passenger (Ps) phase differences of FIGS. 4A and 4B. Near-side refers to the speaker that is closest to the location being measured and far-side refers to the speaker that is furthest from the listening location being measured. As can be seen in FIG. 4C, the phase response for the driver (Dr) listening position and the phase response for the (Ps) listening position are asymmetrical and there are several areas of incoherent phase where phase value exceeds or falls below the preferred zone of ±90.

Figure 5:
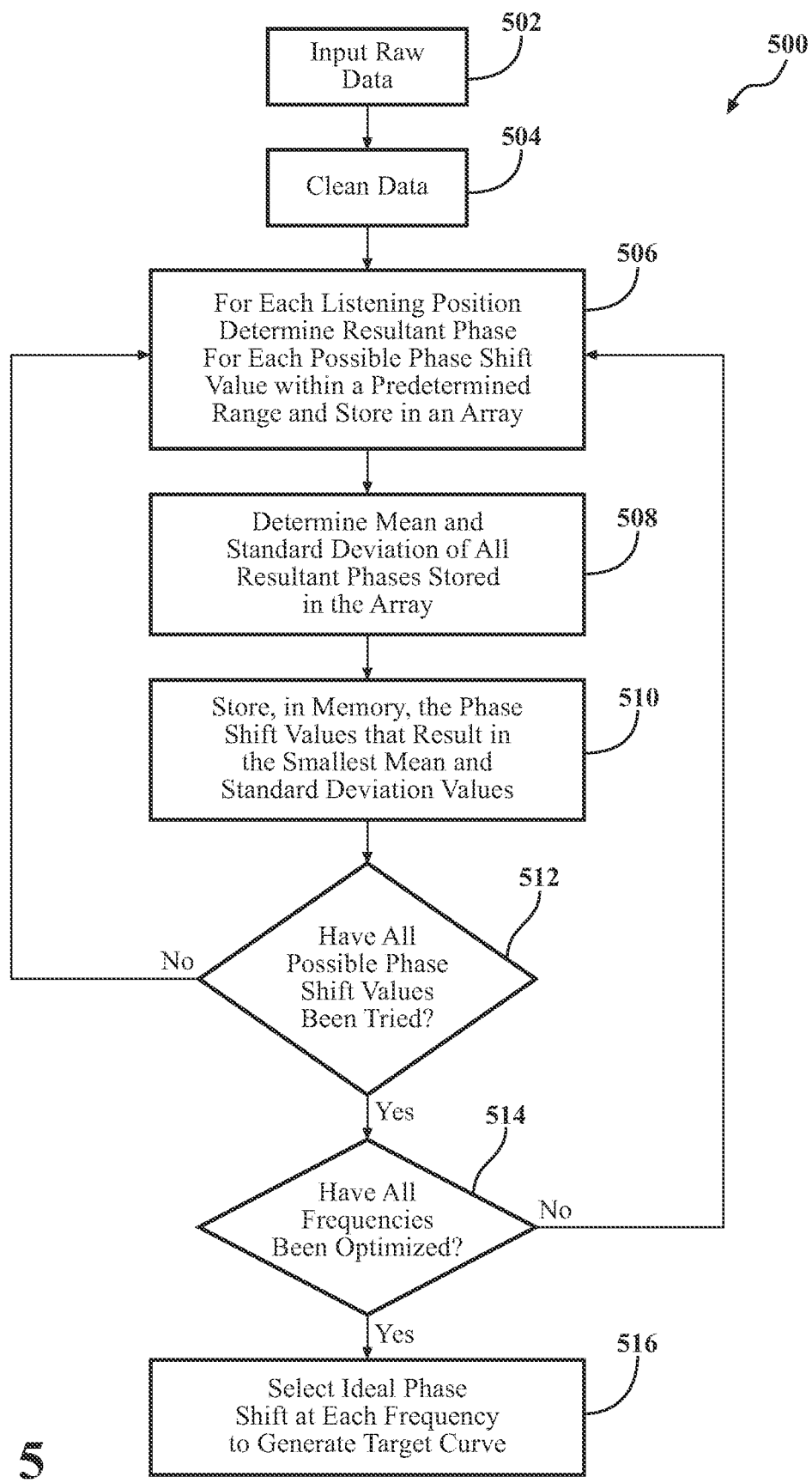
FIG. 5 is a flow chart of a method for phase optimization.

FIG. 5 is a flow diagram 500 of a method for tuning any audio system is shown. One or more text files of raw, untuned data of measured IR of the audio system for each speaker location fat each listening position is input 502, or imported, to a phase optimizer. As discussed above, the measurement system is decoupled from the phase optimizer and data for each set of IR measurements has been stored in a text file format, for example as Comma-separated Values (CSV) or in a tab-delimited text file format. The phase optimizer cleans 504 the raw data by detecting and removing or correcting, any incorrect, incomplete, irrelevant, and duplicate data to ensure only good data is used by the phase optimizer in subsequent steps of the method.

For each listening position in the listening environment, the optimizer determines 506, for every phase shift value within a predetermined range of ±180, a resulting phase difference. This step is repeated for each listening position and stored in an array.

The phase optimizer determines 508 mean and standard deviation of resultant phase, or phase difference, (i.e., raw phase+phase shift) in each listening position, and the values are stored in the array. The phase optimizer stores 510 the phase shift value with the smallest mean and standard deviation values.

This is repeated 512 for each listening position and for all phase shift values. This is also repeated 514 until all possible frequencies have been optimized.

When all the possible phase shift values have been tried and all possible frequencies have been optimized, the optimizer generates 516 a phase shift target curve. To generate the phase shift targe curve, the optimizer selects the ideal phase shift at each frequency. The ideal phase shift is the resultant phase that results in the smallest mean and standard deviation value. The optimizer has parsed, formatted, and optimized phase correlation to generate the phase shift target curve, which is representative of an ideal phase shift at every frequency. The phase shift optimizer of the inventive subject matter optimizes average phase coherence in each set and consistency between seats.

Figure 6:
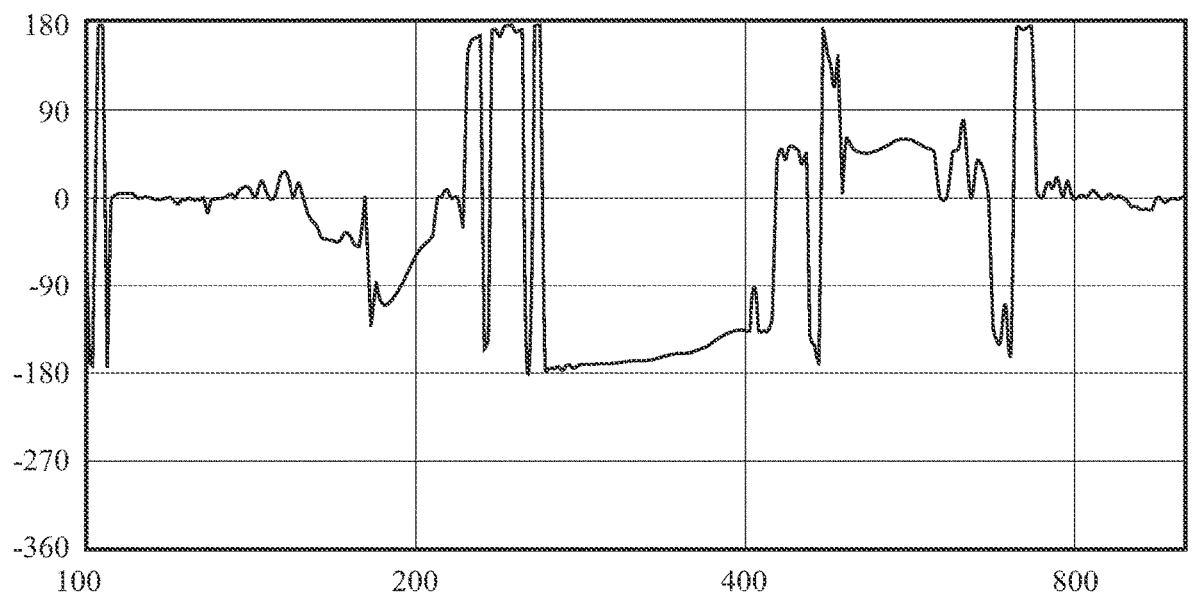
FIG. 6 is a phase shift target curve.

FIG. 6 is a graph of the phase shift target curve that is output from the phase optimizer. When the phase shift is implemented, using either FIR filters or approximated with bi-quad all-pass filters, the result is an optimized phase coherence for the audio system.

Figure 7:
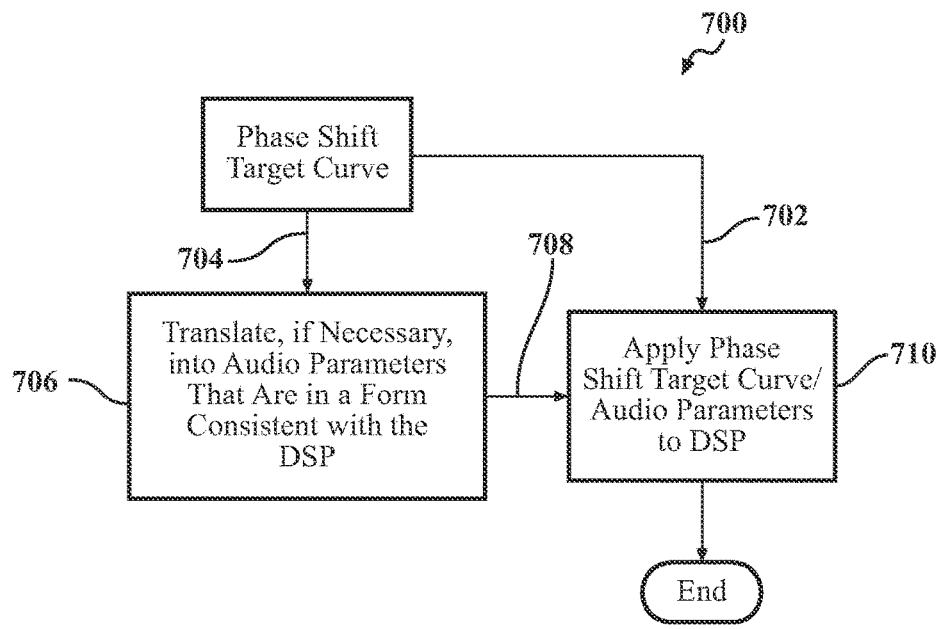
FIG. 7 is a flow chart of a method that includes an optional translator module.

In one or more embodiments shown in FIG. 7, the phase shift target curve generated by the phase optimizer input 702 directly to the DSP of the audio system. Alternatively, the phase shift target curve may be input 704 to the translation module. The translation module translates 706, if necessary, the target curve into parameters that are compatible with the DSP. This step is optional based on the DSP and its associated filter configuration. In some instances, the phase shift target curve may be pushed directly 702 to the DSP for execution without having to translate the parameters. For example, if the phase shift target curve is in a data format that is acceptable to the DSP, it may be pushed directly to the DSP without translation. If translation into audio parameters is needed, the audio parameters are input 708 to the DSP. The DSP applies 710 either the phase shift target curve, or depending on the DSP, the audio parameters input from the translation module.

Figure 8A:
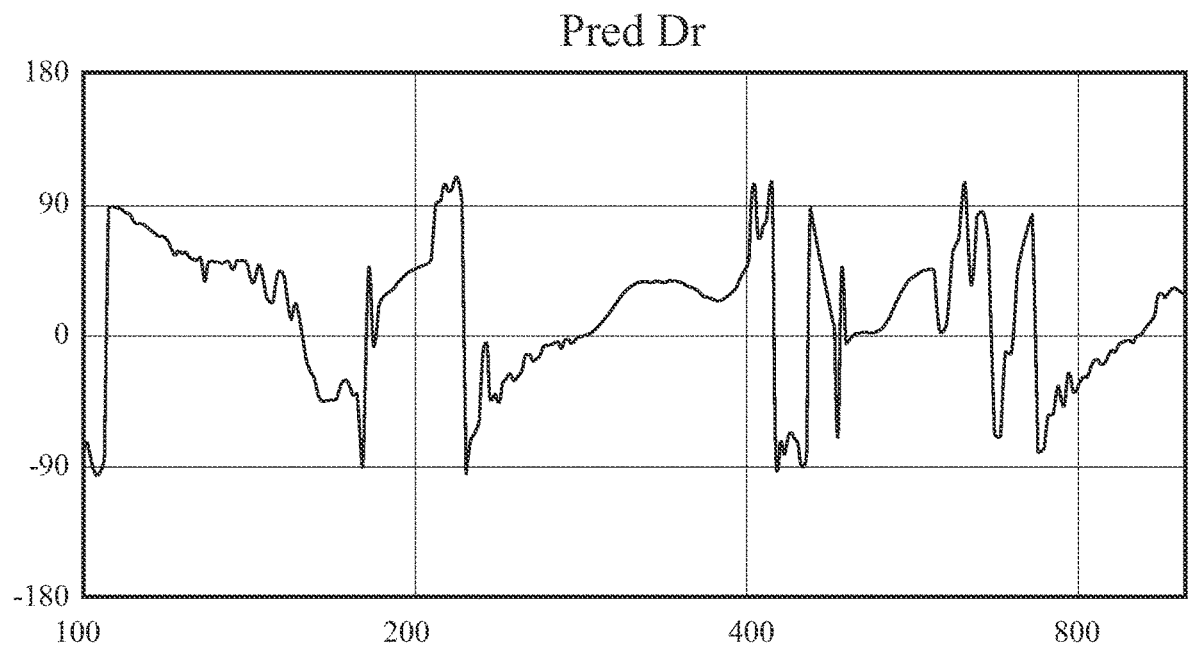
FIG. 8A is a graph representing the predicted tuned phase response in the first listening position.
Figure 8B:
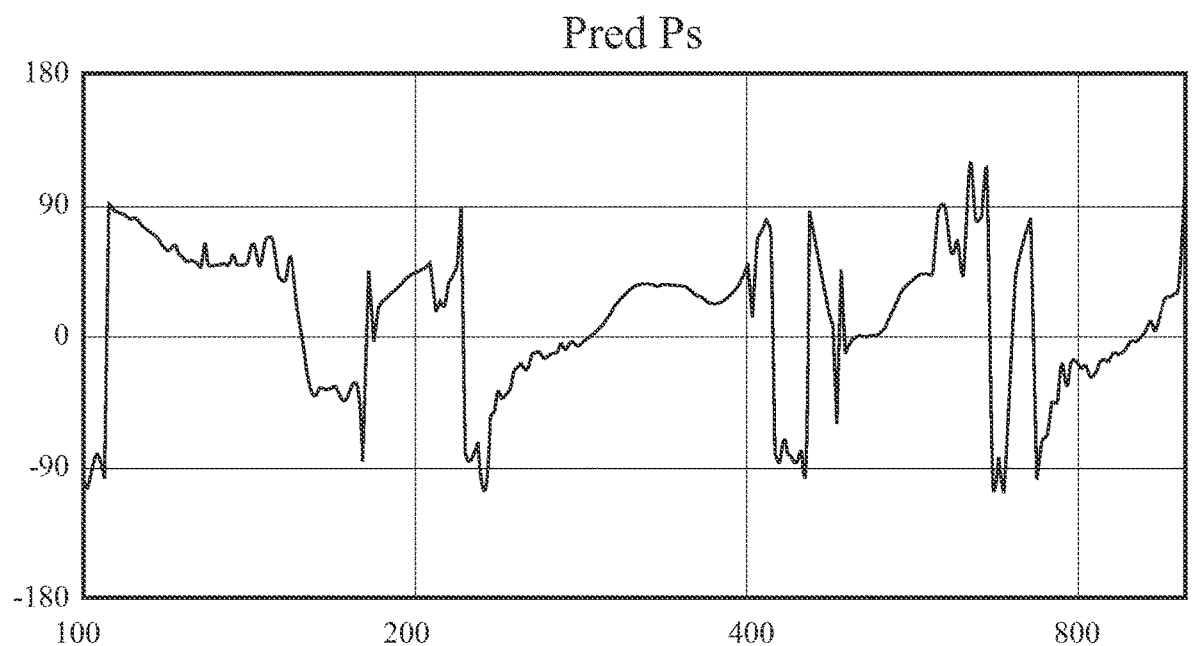
FIG. 8B is a graph representing the predicted tuned phase response in the second listening position.
Figure 8C:
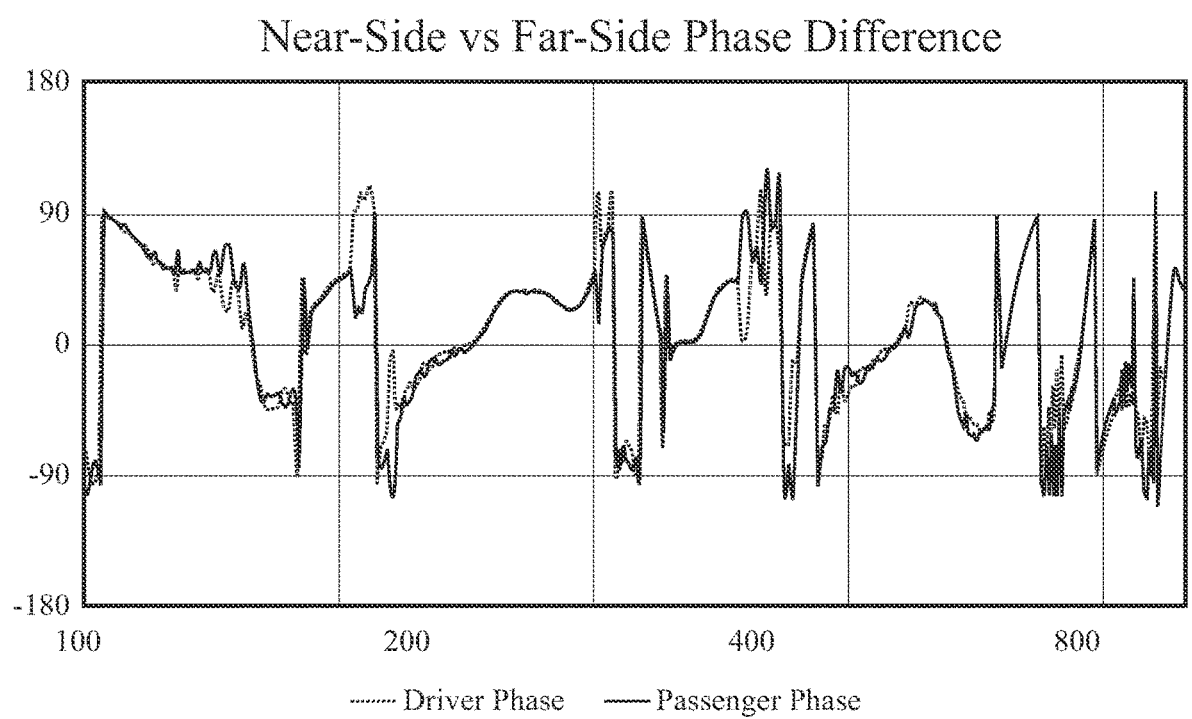
FIG. 8C is a comparison graph of FIGS. 8A and 8B.

FIG. 8A is a graph of the predicted IR of the first speaker at the first and second listening positions. FIG. 8B is a graph of the predicted IR of the second speaker at the first and second listening positions. And FIG. 8C graph representing a comparison of FIGS. 8A and 8B. FIG. 8C represents a plot of near-side and far-side phase difference for the driver (Dr) phase and the passenger (Ps) phase.

Referring to FIG. 8A the curve is now within the ±90 preferred zone. Similarly, FIG. 8B after the phase shift target curve is applied, the curve is now within the ±90 preferred zone. And in FIG. 8C, after the phase shift target curve has been applied and a comparison of FIGS. 8A and 8B is made, the phase response for the first speaker location and the phase response for the second speaker location are now symmetrical for both listening positions 320a and 320b and phase value remains within the preferred zone of ±90.

In the foregoing specification, the present disclosure has been described with reference to specific exemplary embodiments. The specification and figures are illustrative, rather than restrictive, and modifications are intended to be included within the scope of the present disclosure. Accordingly, the scope of the present disclosure should be determined by the claims and their legal equivalents rather than by merely the examples described.

For example, the steps recited in any method or process claims may be executed in any order, may be executed repeatedly, and are not limited to the specific order presented in the claims. Additionally, the components and/or elements recited in any apparatus claims may be assembled or otherwise operationally configured in a variety of permutations and are accordingly not limited to the specific configuration recited in the claims. Any method or process described may be carried out by executing instructions with one or more devices, such as a processor or controller, memory (including non-transitory), sensors, network interfaces, antennas, switches, actuators to name some examples.

Benefits, other advantages, and solutions to problems have been described above regarding embodiments; however, any benefit, advantage, solution to problem or any element that may cause any particular benefit, advantage, or solution to occur or to become more pronounced are not to be construed as critical, required, or essential features or components of any or all the claims.

The terms "comprise", "comprises", "comprising", "having", "including", "includes" or any variation thereof, are intended to reference a non-exclusive inclusion, such that a process, method, article, composition, or apparatus that comprises a list of elements does not include only those elements recited but may also include other elements not expressly listed or inherent to such process, method, article, composition, or apparatus. Other combinations and/or modifications of the above- described structures, arrangements, applications, proportions, elements, materials, or components used in the practice of the present disclosure, in addition to those not specifically recited, may be varied, or otherwise particularly adapted to specific environments, manufacturing specifications, design parameters or other operating requirements without departing from the general principles of the same.

What is claimed is:

1. An automated phase optimization system for tuning an audio system having one or more loudspeakers, the audio system is installed in a listening environment having one or more listening positions, the system comprising:
   a processor to receive a text file input of impulse response (IR) data measurements for each loudspeaker from each listening position measured for all possible frequencies within a predetermined range of frequencies;
   a phase optimizer executable, by the processor, to optimize each frequency in the range of predetermined frequencies, the phase optimizer is configured to:
   a. apply a phase shift value, within predetermined range of phase shift values, to each IR data measurement;
   a. determine a resultant phase value for each possible phase shift value;
   b. store the resultant phase values in an array;
   c. calculate mean and standard deviation for the resultant phase values stored in the array;
   d. compare the mean and standard deviations stored in the array;
   e. select, and store in memory, phase shift values that result in the resultant phase values having the smallest mean and standard deviations;
   f. repeat "a" through "e" for all possible phase shift values within the predetermined range of phase shift values;
   g. repeat "f" for all possible frequencies within the predetermined range of frequencies; and
   a phase shift target curve generated and output by the phase optimizer, the phase shift target curve is generated by selecting phase shift values for each frequency that result in resultant phases having the smallest mean and standard deviation.

2. The system of claim 1, wherein the phase shift target curve further comprises a phase shift target curve generated by the phase optimizer executable, by the processor, to select an ideal phase shift value for each possible frequency in the predetermined range of frequencies.

3. The system of claim 2, wherein the ideal phase shift value is the phase shift value that has the smallest mean and standard deviation.

4. The system of claim 1, wherein the phase shift target curve is in a format that is compatible with the audio system.

5. The system of claim 1, further comprising a translator module, the translator module executable, by the processor, to:
 receive the phase shift target curve from the phase optimizer; and
 translate the phase shift target curve into audio parameters that are consistent with a filter configuration of a digital signal processor of the audio system.

6. The system of claim 5, wherein the translator module is executable, by the processor, to import the audio parameters to a digital signal processor of the audio system for tuning the audio system.

7. A method for automatically generating a phase shift target curve, the phase shift target curve is applied to a digital signal processor for tuning an audio system, the method is carried out in one or more processors having computer executable instructions stored in non-volatile memory, the one or more processors are configured to carry out the steps of:
 receiving, at an optimizer module, a text file containing impulse response measurements taken for each loudspeaker from each listening position in the audio system;
 a. applying all possible phase shift values to each impulse response measurement in the text file, all possible phase shift values are within a predetermined range of phase shift values;
 b. determining a resultant phase value for each possible phase shift value;
 c. storing the resultant phase values in an array;
 d. determining mean and standard deviation for the resultant phase values stored in the array;
 e. comparing the mean and standard deviations stored in the array;
 f. selecting, and storing in a memory, phase shift values that result in the resultant phase values having the smallest mean and standard deviations;
 g. repeating the steps of "a" through "f" for all possible phase shift values;
 h. repeating the step of "g" until all possible frequencies have been optimized;
 generating, at the optimizer module, a phase shift target curve from phase shift values that result in the resultant phase values with the smallest mean and standard deviation for each possible frequency; and
 outputting, at the optimizer module, the phase shift target curve.

8. The method as claimed in claim 7, further comprising the steps of:
 receiving, at a translation module, the phase shift target curve;
 determining, in the translation module, a format for the phase shift target curve that is required by the digital signal processor in the audio system; and
 prior to outputting the phase shift target curve, translating the phase shift target curve into the format required by the digital signal processor in the audio system.

9. The method as claimed in claim 8, further comprising the step of importing the translated phase shift target curve to the digital signal processor.

10. The method as claimed in claim 9, wherein the digital signal processor has instructions, stored in a non-transitory memory, and is configured to execute the steps of:
 receiving the phase shift target curve;
 and applying the phase shift target curve to parameters of the audio system to tune the audio system.

11. A phase optimization system for generating a phase shift target curve that may be applied to a digital signal processor to tune an audio system, the phase optimization system comprising:
 a text file containing a set of impulse response measurements of the audio system, the impulse response measurements are taken by, and received from, a measurement system that is decoupled from the phase optimization system;
 a phase optimizer module for optimizing all possible frequencies within a predetermined range of frequencies, the phase optimizer module is executed in a processor having computer executable instructions stored in non-volatile memory, the phase optimizer configured to;
 a. apply a shift value for each impulse response measurement in the text file;
 b. determine a resultant phase value for each possible phase shift value within the predetermined range;
 c. store the resultant phase values for each possible phase shift value in an array;
 d. determine mean and standard deviation for the resultant phase values stored in the array;
 e. compare the mean and standard deviations stored in the array;
 f. select, and store in a memory, the phase shift values that result in the resultant phase values having smallest mean and standard deviations;
 g. repeat "a" through "f" for all possible phase shift values, all possible phase shift values are within a predetermined range of phase shift values;
 h. repeating "f" for all possible frequencies; and
 a phase shift target consisting of the resultant phase values having the smallest mean and standard deviations for each possible frequency within the predetermined range of frequencies, the phase shift target curve is output to the audio system.

12. The system of claim 11, further comprising a translation module executable by the processor, the translation module configured to:
 receive the phase shift target curve from the phase optimizer module; and
 translate the phase shift target curve into a format that is compatible with the audio system to be tuned before the phase shift target curve is output to the audio system.

13. The system of claim 12, wherein the translation module is in communication with a digital signal processor of the audio system and the translation module is configured to import the translated phase shift target curve to the digital signal processor of the audio system.

\* \* \* \* \*